US010261134B2

(12) United States Patent
Joe

(10) Patent No.: US 10,261,134 B2
(45) Date of Patent: Apr. 16, 2019

(54) APPARATUS FOR ESTIMATING CHARGE STATE OF SECONDARY BATTERY AND METHOD THEREFOR

(71) Applicant: LG CHEM, LTD., Seoul (KR)

(72) Inventor: Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 174 days.

(21) Appl. No.: 15/324,832

(22) PCT Filed: Oct. 21, 2015

(86) PCT No.: PCT/KR2015/011162
§ 371 (c)(1),
(2) Date: Jan. 9, 2017

(87) PCT Pub. No.: WO2016/064198
PCT Pub. Date: Apr. 28, 2016

(65) Prior Publication Data
US 2017/0199247 A1    Jul. 13, 2017

(30) Foreign Application Priority Data

Oct. 24, 2014 (KR) .................. 10-2014-0145530
Oct. 20, 2015 (KR) .................. 10-2015-0146228

(51) Int. Cl.
*H04Q 9/00* (2006.01)
*G01R 31/36* (2019.01)
(Continued)

(52) U.S. Cl.
CPC ....... *G01R 31/3648* (2013.01); *G01R 19/165* (2013.01); *G01R 31/36* (2013.01);
(Continued)

(58) Field of Classification Search
CPC ................................ G01R 31/3648
See application file for complete search history.

(56) References Cited

U.S. PATENT DOCUMENTS

| 7,521,895 B2 | 4/2009 | Plett |
| 7,593,821 B2 | 9/2009 | Plett |

(Continued)

FOREIGN PATENT DOCUMENTS

| KR | 10-2007-0088761 A | 8/2007 |
| KR | 10-2008-0104296 A | 12/2008 |

(Continued)

OTHER PUBLICATIONS

International Search Report (PCT/ISA/210) issued in PCT/KR2015/011162, dated Feb. 2, 2016.

(Continued)

*Primary Examiner* — Manuel L Barbee
*Assistant Examiner* — Raymond L Nimox
(74) *Attorney, Agent, or Firm* — Birch, Stewart, Kolasch & Birch, LLP

(57) ABSTRACT

Apparatus for estimating charge state of secondary battery and method therefor are disclosed. The apparatus includes a control unit configured to estimate the state of charge of the secondary battery by repeatedly performing an algorithm of the Extended Kalman Filter by using a state equation that time-updates a state parameter including the state of charge of the secondary battery and a polarization voltage of the secondary battery, and an output equation that predicts the voltage of the secondary battery using an open circuit voltage according to the state of charge, the polarization voltage, and an internal resistance voltage generated by an internal resistance of the secondary battery, and the control unit increases a difference between state of charge noise and polarization voltage noise of the Extended Kalman Filter when the secondary battery becomes key-off state.

16 Claims, 6 Drawing Sheets

(51) Int. Cl.
*G08C 19/02* (2006.01)
*H01M 10/42* (2006.01)
*H01M 10/48* (2006.01)
*G01R 19/165* (2006.01)
*H01M 10/0525* (2010.01)

(52) U.S. Cl.
CPC ..... *G01R 31/3624* (2013.01); *G01R 31/3651* (2013.01); *G08C 19/02* (2013.01); *H01M 10/0525* (2013.01); *H01M 10/4285* (2013.01); *H01M 10/48* (2013.01); *H04Q 9/00* (2013.01); *G08C 2201/10* (2013.01); *G08C 2201/93* (2013.01); *H01M 2010/4278* (2013.01)

(56) References Cited

U.S. PATENT DOCUMENTS

| | | | | |
|---|---|---|---|---|
| 2007/0299620 | A1* | 12/2007 | Yun | B60L 11/1861 |
| | | | | 702/63 |
| 2010/0153038 | A1* | 6/2010 | Tomura | G01R 31/3624 |
| | | | | 702/63 |
| 2010/0280777 | A1* | 11/2010 | Jin | B60L 3/0046 |
| | | | | 702/63 |
| 2014/0074416 | A1* | 3/2014 | Park | G01R 31/3651 |
| | | | | 702/63 |
| 2014/0218040 | A1 | 8/2014 | Kim | |
| 2014/0244225 | A1 | 8/2014 | Balasingam et al. | |
| 2014/0257726 | A1 | 9/2014 | Baba et al. | |
| 2015/0137822 | A1 | 5/2015 | Joe et al. | |
| 2016/0139210 | A1* | 5/2016 | Coenen | B60L 3/0046 |
| | | | | 702/63 |

FOREIGN PATENT DOCUMENTS

| | | |
|---|---|---|
| KR | 10-2013-0105123 A | 9/2013 |
| KR | 10-2013-0139759 A | 12/2013 |
| KR | 10-2014-0099372 A | 8/2014 |

OTHER PUBLICATIONS

Plett, Gregory L., "Extended Kalman filtering for battery management systems of LiPB-based HEV battery packs Part 1. Background", Journal of Power Sources, vol. 134, 2004, pp. 252-261.

\* cited by examiner

US 10,261,134 B2

APPARATUS FOR ESTIMATING CHARGE STATE OF SECONDARY BATTERY AND METHOD THEREFOR

TECHNICAL FIELD

The present disclosure relates to an apparatus and a method for estimating a state of charge of a secondary battery using Extended Kalman Filter.

The present application claims priority to Korean Patent Application No. 10-2014-0145530 filed on Oct. 24, 2014, and Korean Patent Application No. 10-2015-0146228 filed on Oct. 20, 2015 in the Republic of Korea, the disclosures of which are incorporated herein by reference.

BACKGROUND ART

Secondary batteries are repeatedly chargeable and dischargeable and thus are used as power source in a variety of fields.

For example, the secondary battery is used in a portable apparatus such as portable phone, laptop computer, digital camera, video camera, tablet computer, power tool, and so on that can be carried around in a user's hand.

Further, the secondary battery is used in a variety of electrically-driven power apparatus such as electric bicycle, electric motorcycle, electric vehicle, hybrid vehicle, electric ship, electric airplane, and so on.

Further, the area of using the secondary battery has gradually increased, from a power storage apparatus used for storing power generated with new renewable energy or surplus generated power to even uninterruptible power system for stable power feed to a variety of information communication apparatuses including server computer and communication base station.

The "state of charge" of the secondary battery represents a relative ratio of currently remaining capacity with reference to the capacity of a fully-charged battery, and it is expressed by percent or by numbers between 0 and 1.

Since the state of charge is indicative of an amount of energy remaining in the secondary battery, it is the essentially necessary parameter to control charging and discharging of the secondary battery. When the state of charge reaches 100%, charging has to stop, or when the state of charge reaches 0%, discharging has to stop. Further, the state of charge is utilized to control power of the secondary battery or estimate state of health of the secondary battery.

The state of charge may be estimated with ampere counting. The ampere counting determines the state of charge by integrating the charge current and discharge current over time. However, the ampere counting has a deteriorating accuracy as time elapses. This is because the error of a sensor that measures currents is accumulated over time.

Meanwhile, mathematical algorithms are utilized to estimate the state of charge of a battery. Most of such mathematical algorithms are derived from a circuit model. However, it is difficult to derive a perfect battery model that can accurately simulate the non-linear operational characteristics of the battery.

Recently, the Extended Kalman Filter (EKF) has been utilized as a tool to estimate the state of charge of the battery. The EKF is a probability statistical technique that estimates the state of an interior of a system by using measurable parameters. However, EKF has a gradually deteriorating accuracy as the secondary battery is degraded. This is because the parameters of the EKF change as the secondary battery is degraded.

For example, most EKF includes capacity and resistance of the secondary battery as parameters. While the capacity decreases and the resistance increases as the secondary battery is degraded, it is difficult to accurately update these changes.

Accordingly, it is necessary to adaptively update EKF according to the state of health of the secondary battery. The problem is that it is difficult to accurately estimate the state of health of the secondary battery while the secondary battery is in use. Further, the state of health is influenced by the environment in which the secondary battery is being used. For example, even when the parameters of EKF are updated according to the state of health, regardless of whether EKF is updated or not, the accuracy of EKF is not ensured if the secondary battery has been used in harsher than normal condition.

DISCLOSURE

Technical Problem

The present disclosure is designed to solve the problems of the related art, and therefore the present disclosure is directed to providing a method of using Extended Kalman Filter (EKF) that can estimate a state of charge of a secondary battery accurately irrespective of changes in capacity or resistance due to degradation of the secondary battery, and providing an apparatus and a method capable of accurately estimating a state of charge of a secondary battery by utilizing such method of using EKF.

Technical Solution

In one aspect of the present disclosure, there is provided an apparatus for estimating a state of charge of a secondary battery with an Extended Kalman Filter, which may include a sensor unit configured to measure a voltage and a current of the secondary battery at time interval; and a control unit electrically connected to the sensor unit and configured to estimate the state of charge of the secondary battery by repeatedly performing an algorithm of the Extended Kalman Filter by using a state equation that time-updates a state parameter including the state of charge of the secondary battery and a polarization voltage of the secondary battery, and an output equation that predicts the voltage of the secondary battery using an open circuit voltage according to the state of charge, the polarization voltage, and an internal resistance voltage generated by an internal resistance of the secondary battery.

Preferably, the control unit determines the secondary battery is in key-off state using the measured current, and when implementing the algorithm of the Extended Kalman Filter, increases a difference between a noise regarding the state of charge (hereinafter, state of charge noise), and a noise regarding the polarization voltage (hereinafter, polarization voltage noise).

According to one aspect, the control unit may increase the state of charge noise and fix the polarization voltage noise.

According to another aspect, the control unit may fix the state of charge noise and decrease the polarization voltage noise.

According to yet another aspect, the control unit may increase the state of charge noise and decrease the polarization voltage noise.

According to yet another aspect, when implementing the algorithm of the Extended Kalman Filter, the control unit may decrease a sensor noise regarding the current and/or voltage.

According to the present disclosure, the state equation may include a state of charge update equation that updates the state of charge with ampere-counting according to time.

Further, the state equation may include a polarization voltage update equation that updates the polarization voltage with a RC circuit according to time.

Preferably, the output equation may represent the voltage of the secondary battery as an output parameter according to a sum of the open circuit voltage, the polarization voltage, and the internal resistance voltage.

According to one aspect, the apparatus for estimating state of charge of the secondary battery according to the present disclosure may additionally include a storage unit connected to the control unit, and the control unit may store a convergence value of the state of charge estimated after key-off time of the secondary battery into the storage unit as a current state of charge of the secondary battery.

According to another aspect, the apparatus for estimating state of charge of the secondary battery according to the present disclosure may additionally include a display unit connected to the control unit, and the control unit may display a convergence value of the state of charge estimated after key-off time of the secondary battery as a current state of charge of the secondary battery in a form of graphic user interface (GUI) on the display unit.

According to yet another aspect, the apparatus for estimating state of charge of the secondary battery according to the present disclosure may additionally include a communication interface connected to the control unit, and the control unit may output a convergence value of the state of charge estimated after key-off time of the secondary battery as a current state of charge of the secondary battery to outside through the communication interface.

Optionally, the control unit may estimate a convergence value of the state of charge estimated after the key-off time of the secondary battery as a current state of charge of the secondary battery, and estimate a state of health of the secondary battery using changes in the estimated current state of charge.

In one aspect of the present disclosure, there is provided a method for estimating a state of charge of a secondary battery with an Extended Kalman Filter, which may include: (a) measuring, at time intervals, a voltage and a current of the secondary battery; (b) repeatedly implementing an algorithm of the Extended Kalman Filter including time-updating a state parameter including the state of charge of the secondary battery and a polarization voltage of the secondary battery, time-updating an error covariance of the state parameter, predicting the voltage of the secondary battery corresponding to an output parameter using an open circuit voltage according to the state of charge, the polarization voltage, and an internal resistance voltage according to an internal resistance of the secondary battery, estimating a gain of the Extended Kalman Filter, estimating the state parameter using an error between the predicted voltage and the measured voltage, and the gain, and correcting the error covariance of the state parameter using the gain; (c) determining whether or not the secondary battery is in key-off state using the measured current; and (d) when determining that the secondary battery is in key-off state, when implementing an algorithm of the Extended Kalman Filter, increasing a difference between a noise regarding the state of charge, and a noise regarding the polarization voltage.

Preferably, at step (d), the state of charge noise may be increased and the polarization voltage noise may be fixed. Alternatively, the state of charge noise may be fixed and the polarization voltage noise may be decreased. Alternatively, the state of charge noise may be increased and the polarization voltage noise may be decreased.

More preferably, at step (d), when an algorithm of the Extended Kalman Filter is implemented, a sensor noise for the current and/or the voltage may be decreased.

According to one aspect, the method according to the present disclosure may additionally include estimating a convergence value of the state of charge estimated after key-off time of the secondary battery as a current state of charge of the secondary battery.

According to another aspect, the method according to the present disclosure may additionally include storing, displaying or outputting the current state of charge.

Advantageous Effects

The present disclosure gives the following effects. In estimating a state of charge of a secondary battery by using Extended Kalman Filter, the present disclosure can accurately estimate the state of charge of the secondary battery even when a parameter such as capacity or resistance changes due to degradation of the secondary battery, and can reliably control the operations of the secondary battery by utilizing the estimated state of charge.

DESCRIPTION OF DRAWINGS

The accompanying drawings illustrate preferred embodiments of the present disclosure and, together with the foregoing disclosure, serve to provide further understanding of the technical features of the present disclosure. However, the present disclosure is not to be construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, and not intended to limit the scope of the disclosure, so it should be understood that other equivalents and modifications could be made thereto without departing from the spirit and scope of the disclosure.

In the description provided below, the secondary battery refers to the lithium secondary battery. The "lithium secondary battery" as used herein encompasses a secondary battery in which lithium ions act as the operating ions and thereby inducing electrochemical reaction in the positive electrode and the negative electrode during charging and discharging.

Meanwhile, while the name of the secondary battery may vary according to types of electrolyte or separator used in the lithium secondary battery, types of packaging materials used for packing the secondary battery, inner or outer structure of the lithium secondary battery, and so on, the secondary battery is to be interpreted as falling under the scope of the lithium secondary battery described above as long as lithium ions are used for operating ions in such secondary battery.

The present disclosure is applicable to other secondary batteries as well as the lithium secondary battery. Accordingly, irrespective of the type of the secondary battery, even the secondary battery having operating ions other than lithium ions is to be interpreted as falling under the scope of the present disclosure as long as such secondary battery can apply the technical concept of the present disclosure.

Further, the secondary battery is not limited by the number of elements constructing the same. Accordingly, the secondary battery should be interpreted as encompassing not only a single cell including an assembly of positive electrode/separator/negative electrode and electrolyte in a single package, but also an assembly of single cells, a module in which a number of assemblies are connected in series and/or in parallel, a pack in which a number of modules are connected in series and/or in parallel, a battery system in which a number of packs are connected in series and/or in parallel, and so on.

Figure 1:
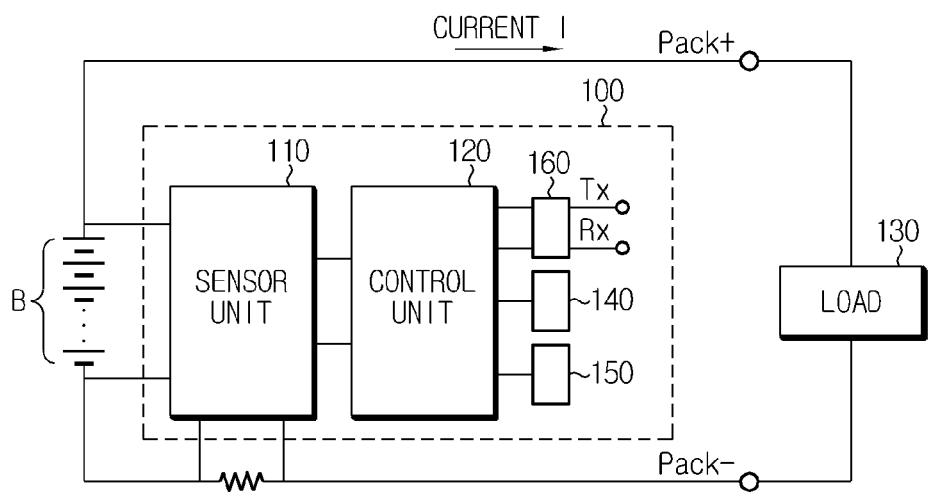
FIG. 1 is a block diagram of a configuration of an apparatus for estimating a state of charge of a secondary battery according to an exemplary embodiment.

FIG. 1 is a block diagram schematically illustrating a configuration of an apparatus 100 (hereinafter, briefly referred to as "SOC estimating apparatus") for estimating a state of charge of a secondary battery according to an exemplary embodiment.

As illustrated, the SOC estimating apparatus 100 includes a sensor unit 110 and a control unit 120, and is electrically connected to the secondary battery B to estimate the state of charge of the secondary battery B with the Extended Kalman Filter (EKF).

The secondary battery B is electrically connected to a load 130. The load 130 is included in a variety of electrically-driven apparatuses, and it refers to an energy consuming apparatus included in the electrically-driven apparatus to be operated by the electrical energy supplied as the secondary battery B is discharged.

As a non-limiting example, the load 130 may be a rotary power apparatus such as a motor, a power converting apparatus such as an inverter, and so on. Meanwhile, the present disclosure is not limited to a certain type of load 130.

The SOC estimating apparatus 100 may also additionally and optionally include a storage unit 140. The storage unit 140 is not limited to any specific type as long as it is a storage medium that can record and erase information.

In one example, the storage unit 140 may be RAM, ROM, register, hard disk, optical recording medium or magnetic recording medium.

The storage unit 140 may be connected to the control unit 120 via, for example, data bus, and so on to enable access for the control unit 120.

The storage unit 140 stores and/or updates and/or erases and/or transmits programs including a variety of control logics implemented by the control unit 120, and/or data generated when the control logics are implemented.

The storage unit 140 is logically dividable into two or more, and not limited from being included in the control unit 120.

The SOC estimating apparatus 100 may also optionally include a display unit 150. The display unit 150 is not limited to any specific type, as long as it can display the information created by the control unit 130 as a graphic user interface (GUI).

In one example, the display unit 150 may be a liquid crystal display, LED display, OLED display, E-INK display, flexible display, and so on.

The display unit 150 may be connected to the control unit 120 either directly or indirectly. In the latter case, the display 150 may be located in an area that is physically separated from the area where the control unit 120 is located. Further, a third-party control unit may be disposed between the display unit 150 and the control unit 120 such that the third-party control unit may receive from the control unit 120 information to be expressed on the display unit 150 and express the received information through the display unit 150. To this purpose, the third-party control unit and the control unit 120 may be connected for transmission and reception of data.

The sensor unit 110 is electrically coupled with the control unit 120 to transmit and receive electrical signals.

Under the control of the control unit 120, the sensor unit 110 repeatedly measures voltage applied across the positive electrode and the negative electrode of the secondary battery B and current flowing into or out of the secondary battery B at time intervals and provides the control unit 120 with the measured voltages and currents. In this case, the voltage and the current may be measured at the same time or at different times.

The sensor unit 110 may include a voltage measuring means to measure the voltage of the secondary battery B, and a current measuring means to measure the current of the secondary battery B.

The voltage measuring means may be composed of a voltage measuring circuit as is generally used in the art. Further, the current measuring means may be composed of hall sensor or a sensor resistance as is generally used in the art. However, the present disclosure is not limited to any specific example.

Since the sensor unit 110 is a representation of a functional block that measures voltage and current of the secondary battery B, those skilled in the art will be easily able to understand that the elements in charge of voltage measurement and the elements in charge of current measurement may be physically separated.

The control unit 120 is an element that is capable of implementing at least one control logic necessary to estimate the state of charge of the secondary battery B by using EKF. A non-limiting example of the control unit 120 may include software that can estimate the state of charge of the secondary battery B with pre-defined EKF algorithms.

In order to apply EFK during estimation of the state of charge of the secondary battery B, it is necessary to define the state equation and the output equation by considering the secondary battery B as one single system.

In a desired exemplary embodiment, the state equation and the output equation may be derived from a circuit model.

Figure 2:
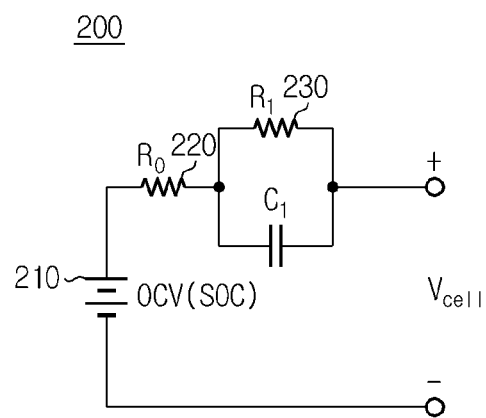
FIG. 2 illustrates a configuration of a circuit model used to derive state equation and output equation of EKF according to an exemplary embodiment.

FIG. 2 illustrates a circuit model 200 according to an exemplary embodiment, from which the state equation and the output equation of EKF can be derived.

Referring to FIG. 2, the circuit model 200 includes an open circuit voltage source 210 that varies according to the state of charge of the secondary battery B. The open circuit voltage formed by the open circuit voltage source 210 may change according to the state of charge, and may be defined as a function such as OCV (SOC) in the circuit model 200.

The open circuit voltage source 210 stimulates open circuit voltage in a circumstance when the secondary battery B has been electrochemically stabilized for a long period of time.

The open circuit voltage formed by the open circuit voltage source 210 may be previously defined through experiments for respective states of charge.

That is, the open circuit voltage of the secondary battery B is measured for each state of charge. The measured data is then interpreted to thereby define the correlation between the open circuit voltage and the state of charge in a form of a function or a look-up table.

The circuit model 200 may additionally include a DC resistor 220 to simulate internal resistance of the secondary battery B. The DC resistor 220 simulates the internal resistance voltage that is formed by the internal resistance during charging or discharging of the secondary battery B.

The internal resistance voltage is referred to as "IR voltage" in the art. Due to the IR voltage, the voltage measured during charging is higher than the open circuit voltage. In contrast, the voltage measured during discharging is lower than the open circuit voltage. The resistance value of the DC resistance 220 may be preset by experiments.

The circuit model 200 may include at least one RC circuit 230 that simulates polarization voltage of the secondary battery B. The RC circuit 230 includes at least one resistor $R_1$ and at least one condenser $C_1$ connected to the resistor R1 in parallel.

The polarization voltage refers to a voltage generated as polarization is accumulated at the positive electrode and the negative electrode during charging or discharging of the secondary battery B. The resistance value and the capacitance value of the RC circuit 230 may be preset by experiments.

Preferably, the state equation and the output equation of the EKF according to the present disclosure are derived from the circuit model 200 described above.

The EKF is an adaptive software algorithm that is capable of statistically estimating a state of a dynamic system in consideration of externally-measurable parameters and disturbance of the system.

The basic principle of the Extended Kalman Filter described above is already well known in the art, as can be found in the thesis by Gregory L. Plett, titled "Extended Kalman Filtering for battery management systems of LiPB-based HEV battery packs Part 1. Background" (Journal of Power Source 134, 2004, 252-261), the disclosure of which is incorporated herein by reference in its entirety.

According to the present disclosure, the state equation of the EKF includes a state of charge (SOC) of the secondary battery and a polarization voltage of the secondary battery as state parameters, and updates the state parameters according to time.

Specifically, the state equation may include two equations based on a time-discrete model as below.

$$SOC[k+1] = SOC[k] - \frac{I[k]\Delta t}{Q_{Capacity}} \quad \text{Equation 1}$$

$$V_1[k+1] = \exp\left(-\frac{\Delta t}{R_1 C_1}\right) V_1[k] + R_1\left(1 - \exp\left(-\frac{\Delta t}{R_1 C_1}\right)\right) I[k] \quad \text{Equation 2}$$

Here, Equation 1 is a SOC update equation that time-updates the SOC as one of the state parameters with ampere counting.

Equation 2 is a polarization voltage update equation that time-updates polarization voltage of the secondary battery as another state parameter, by using the RC circuit 230 included in the circuit model 200.

In Equation 1, Q represents capacity of the secondary battery, k is a time index, I is the current measured at time index k, and $R_1$ and $C_1$ are resistance value and capacitance value of the RC circuit included in the circuit model 200.

The state equation expressed as Equations 1 and 2 may be expressed as a vector state equation like Equation 3 below by using matrix.

$$\begin{bmatrix} SOC_{k+1} \\ V_{1,k+1} \end{bmatrix} = \begin{bmatrix} 1 & 0 \\ 0 & \exp\left(-\frac{\Delta t}{R_1 C_1}\right) \end{bmatrix} \begin{bmatrix} SOC_k \\ V_{1,k} \end{bmatrix} + \begin{bmatrix} \frac{\Delta t}{Capacity} \\ R_1\left(1 - \exp\left(-\frac{\Delta t}{R_1 C_1}\right)\right) \end{bmatrix} I_k \quad \text{Equation 3}$$

where, $R_1$, $C_1$ and Capacity (corresponding to $Q_{capacity}$ in Equation 1) represent electrical characteristic values that can be tuned with the trial & error in order to keep the state error of the system, either directly measured by experiment or estimated by EKF, to a minimum. These values may be fixed or varied according to the state of charge or state of health of the secondary battery.

According to the present disclosure, the output equation of the Extended Kalman Filter may be represented as a discrete time model. That is, the output equation expresses the voltage of the secondary battery as an output parameter by using the open circuit voltage according to the state of charge of the secondary battery, the polarization voltage, and the internal resistance voltage due to the internal resistance of the secondary battery at time index k.

Specifically, the output equation may be expressed as Equation 4 below with reference to time index k.

$$V_{Cell}[k] = V_{OCV}[k] + V_1[k] + I[k]R_0 \quad \text{Equation 4}$$

where, $V_{OCV}[k]$ represents open circuit voltage of the secondary battery, which is the voltage formed by the open circuit voltage source 210 included in the circuit model 200. $V_{OCV}[k]$ may be calculated by using a function or a look-up table that pre-defines correlation between the state of charge and the open circuit voltage. That is, after the state of charge is obtained with Equation 1, the open circuit voltage corresponding to the state of charge may be determined by using the function or the look-up table.

Further, $V_1[k]$ represents voltage formed by the RC circuit 230 of the circuit model 200, which may be determined using the polarization voltage update equation of Equation 2.

Further, $I[k]R_0$ represents internal resistance voltage formed by the DC resistance 220 of the circuit model 200, which may be determined by using a measured current value and a preset resistance value of the DC resistance 220.

According to the present disclosure, the control unit 120 may adaptively estimate the state of charge of the secondary battery B by repeatedly executing Extended Kalman Filter algorithm using the state equation and the output equation described above.

First, the control unit 120 may initialize the state of charge (SOC) and the polarization voltage $V_1$ as the state parameters as below.

Initialization:

$$V_1[0]=0$$

$$SOC[0]=OCV^{-1}(V_{cell}[0])$$

where, $V_{cell}[0]$ represents the initial voltage measured for the first time as the charging or discharging of the secondary battery begins. Further, $OCV^{-1}$ is an inverse transform operator for an operator that transforms state of charge into open circuit voltage. SOC[0] may be easily calculated from the pre-defined correlation between the state of charge and the open circuit voltage.

Here, the pre-defined correlation may be a look-up table or a look-up function. The look-up table may have such data structure that enables mapping the state of charge with reference to the open circuit voltage or vice versa.

Further, the look-up function may take a form of a function that can receive either the state of charge or the open circuit voltage as an input parameter and output the other as an output parameter.

Since the Extended Kalman Filter has robustness against the initial condition, the initial conditions of the state parameter do not necessarily have to be limited to any specific conditions. Accordingly, the initial condition of the state parameter may be set arbitrarily to satisfy the condition that the state of the system estimated by the Extended Kalman Filter is not diverged.

The control unit 120 may time-update the state of charge and the polarization voltage using the state equations 1 and 2 as a predetermined time elapses.

$$SOC[1] = SOC[0] - \frac{I[0]\Delta t}{Q_{Capacity}} \quad \text{Equation 1}$$

$$V_1[1] = \exp\left(-\frac{\Delta t}{R_1 C_1}\right)V_1[0] + R_1\left(1 - \exp\left(-\frac{\Delta t}{R_1 C_1}\right)\right)I[0] \quad \text{Equation 2}$$

In Equations 1 and 2, I[0] is an initial current value initially measured by the sensor unit 110, and delta t is increment cycle of time index.

Further, the control unit 120 may time-update the error covariance of the state parameter using the equation below, where k is 1.

$$\Sigma_{\tilde{x},k}^- = \hat{A}_{k-1} \Sigma_{\tilde{x},k-1}^+ \hat{A}_{k-1}^T + \hat{B}_{k-1} \Sigma_{\tilde{w}} \hat{B}_{k-1}^T \quad \text{Equation 5}$$

In Equation 5, x represents state parameter, k is time index, w is process noise of Extended Kalman Filter, and A and B with symbol ^ are Jacobians obtained from the state equation, and T is transposed matrix operator. The parameter with sigma represents the error covariance of a corresponding parameter. Further, the error covariance attached with minus (−) symbol represents time-updated covariance, and the error covariance attached with plus (+) symbol represents error covariance corrected immediately before.

In Equation 5, when time index k is 1, the initial value of the error covariance for the state parameter in the right side may be preset to prevent divergence of the Extended Kalman Filter, in which case the initial value of the error covariance may preferably be set to 0.

When the error covariance time update is finished, the control unit 120 measures the current I[1] and voltage V[1] of the secondary battery B using the sensor unit 110, and predicts the voltage $V_{cell}[1]$ of the secondary battery as an output parameter, by applying the time-updated state parameter $V_1[1]$, measured current I[1] and open circuit voltage $V_{OCV}[1]$ corresponding to SOC[1] to Equation 4.

$$V_{Cell}[1] = V_{OCV}[1] + V_1[1] + I[1]R_0 \quad \text{Equation 4}$$

Next, the control unit 120 determines Kalman gain L when time index k is 1, by applying the time-updated error covariance to Equation 6 below.

$$L_k = \Sigma_{\tilde{x},k}^- \hat{C}_k^T [\hat{C}_k \Sigma_{\tilde{x},k}^- \hat{C}_k^T + \hat{D}_k \Sigma_{\tilde{v}} \hat{D}_k^T]^{-1} \quad \text{Equation 6}$$

In Equation 6, C and D with symbol ^ at the top are Jacobians obtained from output equation, v is sensor noise of the Extended Kalman Filter, and T is transposed matrix operator.

Next, the control unit 120 corrects the state parameter so as to estimate the state parameter by applying the determined Kalman gain L, the measured voltage V[1], and time-updated state parameter to Equation 7 below.

$$\hat{x}_k^+ = \hat{x}_k^- + L_k(z_k - \hat{z}_k) \quad \text{Equation 7}$$

In Equation 7, x and z each represent the state parameter and the output parameter, symbol − represents that the corresponding state parameter is a time-updated state parameter, symbol + represents that the corresponding state parameter is an estimated state parameter, z with ^ at the top represents the estimated voltage $V_{cell}[1]$ of the secondary battery, and z without ^ at the top represents actually-measured voltage V[1] of the secondary battery.

Preferably, the control unit 120 may estimate the state of charge of the secondary battery by extracting the state of charge from the state parameter estimated with Equation 7.

Lastly, the control unit 120 corrects the error covariance of the state parameter by applying the determined Kalman gain and Jacobian C, and error covariance of the time-updated state parameter to Equation 8 below.

$$\Sigma_{\tilde{x},k}^+ = (I - L_k \hat{C}_k) \Sigma_{\tilde{x},k}^- \quad \text{Equation 8}$$

The series of calculations described above are repeatedly performed every time the time index k increments by 1. Further, the state parameter estimated with Equation 7 and the error covariance of the state parameter corrected with Equation 8 are used again in the calculation cycle of the next cycle to time-update the state parameter and the error covariance thereof.

Preferably, prior to predicting the voltage of the secondary battery B with the output equation, the control unit 120 may determine whether or not the secondary battery is in key-off state by using the current level measured by the sensor unit 110.

Here, the "key-off state" represents a state in which connection between the secondary battery and the load or between the secondary battery and the charging apparatus are severed such that the charging or discharging is substantially stopped. Accordingly, when the secondary battery is in key-off state, the estimated current level may be substantially 0 or reduced close to 0. Accordingly, the control unit 120 may determine whether or not the secondary battery is in key-off state by referring to the measured current level.

When determining that the secondary battery is in key-off state, the control unit 120 increases a difference between the state of charge noise and polarization voltage noise among the process noises of the Extended Kalman Filter to be greater than before key-off state.

That is, the state of charge noise and the polarization voltage noise are set to values tuned by trial & error before key-off of the secondary battery, but upon key-off of the secondary battery, the difference therebetween is intentionally increased.

In one example, the control unit 120 increases the state of charge noise, and fixes the polarization voltage noise. In another example, the control unit 120 fixes the state of charge noise and decreases the polarization voltage noise. In yet another example, the control unit 120 increases the state of charge noise and decreases the polarization voltage noise.

The process noises of the Extended Kalman Filter are $\Sigma \tilde{w}$ included in the second term of Equation 5 used for time-updating the error covariance of the state parameter, and may be expressed by Equation 9 below.

$$\sum \tilde{w} = \begin{bmatrix} \sigma_{soc}^2 & 0 \\ 0 & \sigma_{V_1}^2 \end{bmatrix} \qquad \text{Equation 9}$$

In Equation 9, $\sigma_{soc}^2$ corresponds to the state of charge noise, and $\sigma_{V_1}^2$ corresponds to the polarization voltage noise. The state of charge noise and the polarization voltage noise are parameters tuned by trial & error.

When the difference between the state of charge noise and the polarization voltage noise is deliberately increased with the secondary battery being in key-off state, an effect that the estimated error of the state of charge is removed in short time can be anticipated. Further, such effect can be maintained even when the parameters of the Extended Kalman Filter vary due to degradation of the secondary battery.

That is, the state of charge estimating apparatus according to the present disclosure has robustness against changes in the capacity and internal resistance of the secondary battery which are affected by the degradation of the secondary battery.

Optionally, the control unit 120 may additionally reduce the magnitude of the sensor noise, in addition to adjusting the magnitudes of the process noises of the Extended Kalman Filter in order to further enhance the effect of the present disclosure.

The sensor noise is $\Sigma \tilde{v}$ included in Equation 6 for determining the Kalman gain, and may be expressed by Equation 10 below.

$$\Sigma \tilde{v} = (\sigma \tilde{v})^2 \qquad \text{Equation 10}$$

In Equation 10, $\sigma_v^2$ corresponding to the sensor noise is parameter that is tunable by trial & error.

Meanwhile, the control unit 120 may determine convergence value of the state of charge estimated after key-off time of the secondary battery B as the current state of charge of the secondary battery, and store the determined current state of charge into the storage unit 140.

The current state of charge stored in the storage unit 140 may be used as an initial value of state of charge when the secondary battery changes into Key-on state.

In every key-off of the secondary battery, the control unit 120 may determine convergence value of the state of charge estimated after key-off time of the secondary battery as the current state of charge of the secondary battery, and store the determined current state of charge into the storage unit 140.

Further, the control unit 120 may integrate the charge current and discharge current that flowed while the secondary battery is in key-on state, and store the integrated current into the storage unit 140.

Further, the control unit 120 may estimate the state of health of the secondary battery by applying the changes in the current state of charge and the integrated current stored in the storage unit 140 into Equation 11 below.

$$SOH = \frac{\Delta \int I(t)dt}{Capacity_{initial} \times \Delta SOC} \qquad \text{Equation 11}$$

In Equation 11, the term of the numerator corresponds to the integrated current of the charge current and discharge current while the secondary battery is in key-on state. The left term of the denominator corresponds to initial capacity of the secondary battery. The right term of the denominator corresponds to changes between the current state of charge previously estimated according to the present disclosure in the key-off state that is before the key-on state of the secondary battery begins, and the current state of charge estimated during the present key-off state according to the present disclosure when the key-on state of the secondary battery is terminated so that the secondary battery returns to the key-off state. According to the present disclosure, the state of charge estimated during key-off state has almost no error with reference to the true state of charge. Accordingly, the state of health estimated with Equation 11 has high accuracy.

The control unit 120 may transmit the state of charge estimated after the key-off time of the secondary battery and the current state of charge, which is the convergence value thereof, to another external control unit via a communication interface 160 capable of transmitting and receiving data, or may display these as the GUI through the display unit 150. The 'GUI' as used herein encompasses text, picture, graphic or a combination thereof.

In order to implement a variety of control logics including those described above, the control unit 120 may optionally include processor, application-specific integrated circuit (ASIC), other chipsets, logic circuit, register, communication modem, data processor, and so on, as known in the art. Further, when the control logic is implemented as software, the control unit 120 may be implemented as a set of program modules. In this case, the program modules may be stored at a memory and executed by the processor. The memory may be internal or external to the processor and may be connected with the processor with a variety of known computer components. Further, the memory may be included in the storage unit 140 of the present disclosure. Further, the 'memory' collectively refers to any type of devices where information is stored, and is not intended to refer to any specific memory device.

It is apparent that the control logics of the control unit 120 may construct process of a method for estimating state of a secondary battery according to an embodiment of the present disclosure.

Figure 3:
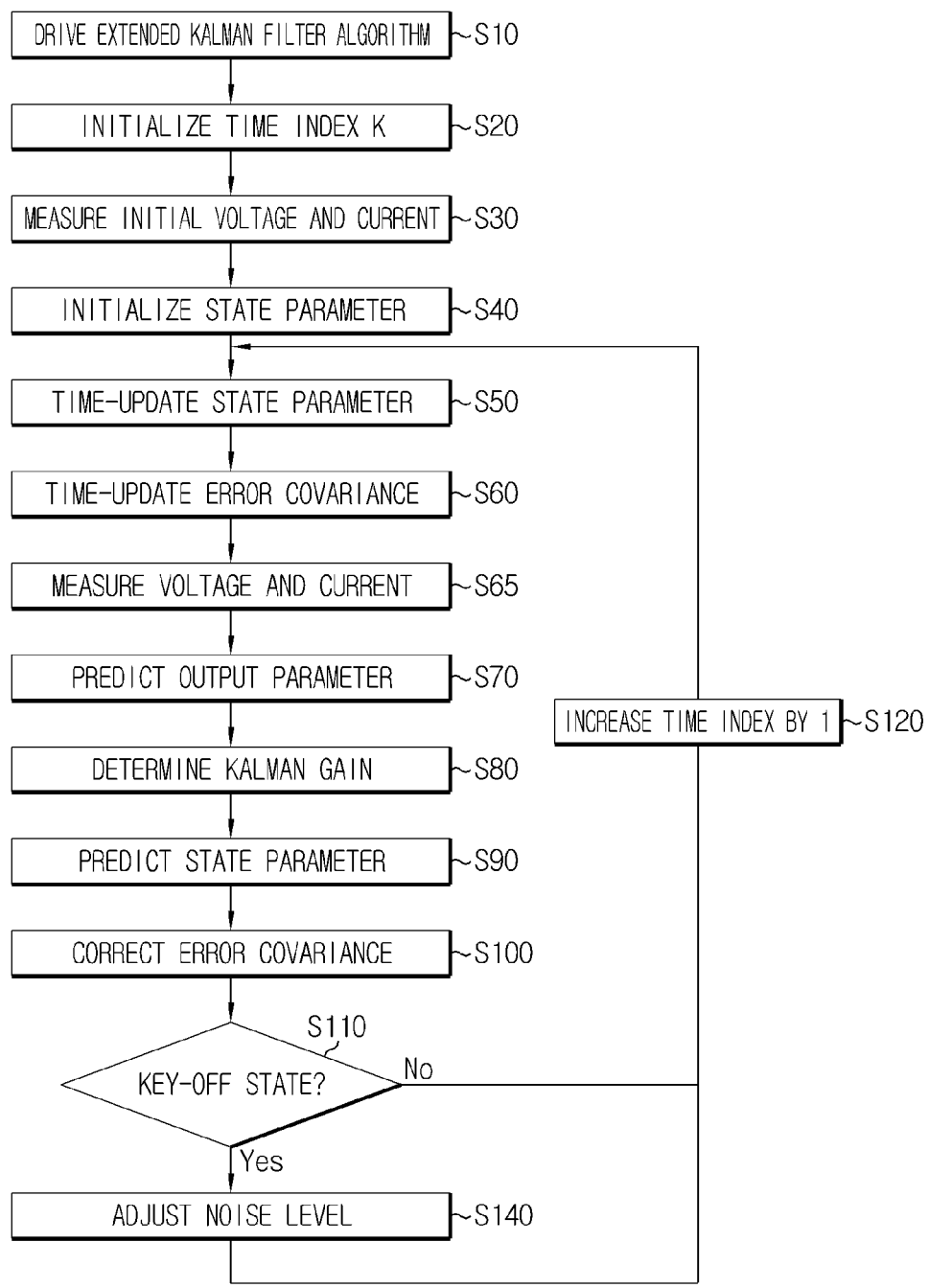
FIG. 3 is a flowchart provided to explain a method for estimating a state of charge of a secondary battery according to an exemplary embodiment.

FIG. 3 is a flowchart illustrating sequence of a method for estimating state of charge of a secondary battery according to an exemplary embodiment of the present disclosure.

First, at S10, the control unit 120 drives the Extended Kalman Filter algorithm according to the present disclosure.

Next, at S20, the control unit 120 initializes time index k. Next, at S30, the voltage and current of the secondary battery are then measured through the sensor unit 110 and stored in the storage unit 110. In this case, the measured voltage and current correspond to $V_{cell}[0]$ and $I[0]$, respectively.

Next, at S40, the control unit 120 initializes the state parameter. The state parameter includes the state of charge and the polarization voltage of the secondary battery. The method of initializing the state parameter has been described above.

Next, at S50, the control unit 120 time-updates the state parameter with the state equation of the Extended Kalman Filter, and at S60, time-updates the error covariance of the state parameter.

Next, at S65, the control unit 120 measures the voltage and current of the secondary battery by using the sensor unit 110, at S70, predicts the voltage of the secondary battery with the output equation of the Extended Kalman Filter, at S80, determines the Kalman gain, at S90, estimates the state parameter of the secondary battery using the difference between the predicted voltage and the measured voltage, and the Kalman gain, and at S100, corrects the error covariance of the state parameter and thus completes the first cycle of the Extended Kalman Filter algorithm. The detailed operations and equations that can be used in each operation have already been described above, and will not be redundantly described below for the sake of brevity.

When the implementation of the Extended Kalman Filter corresponding to the first cycle is finished, at S110, the control unit 120 determines if the secondary battery is in key-off state by using the current level measured at S65. When the estimated current level is substantially 0, it is determined that the secondary battery is in key-off state. When determination at S110 indicates YES, at S140, the control unit 120 increases the difference between the state of charge state noise and the polarization voltage noise among the process noises of the Extended Kalman Filter. Optionally, at S140, the control unit 120 may also reduce the magnitude of the sensor noise, while adjusting the process noises.

When noise adjustment is finished, at S120, the control unit 120 increases time index k by 1 and moves the process to S50. Accordingly, the Extended Kalman Filter algorithm reiterates recursively.

In contrast, when the determination at S110 indicates NO, the control unit 120 skips the noise adjustment operation, increases time index K by 1 at S120, and moves the process to S50. Accordingly, the Extended Kalman Filter algorithm reiterates recursively.

Meanwhile, the control unit 120 may extract the state of charge of the secondary battery from the state parameter estimated after S90, and store the extracted state of charge into the storage unit 140.

Further, the control unit 120 may determine the convergence value of the state of charge estimated after key-off time of the secondary battery to be the current state of charge, and store the same into the storage unit 140.

In one example, the control unit 120 may determine the state of charge value estimated after a predetermined sufficient time from the key-off time of the secondary battery to be the convergence value of the state of charge.

In another example, the control unit 120 may determine the latest estimated state of charge value to be the convergence value of the state of charge, when condition is satisfied such that the change in the state of charge value estimated after the key-off time of the secondary battery is reduced to below a preset reference value.

Further, when the secondary battery changes into key-on state, the control unit 120 may set the current state of charge estimated during key-off state to be the initial value of the state of charge. Here, the key-on state refers to a situation in which the secondary battery is in the state of being charged or discharged. The key-on state may be determined by measuring the current level flowing into or out of the secondary battery. The current state of charge estimated in the key-off state according to the present disclosure has high accuracy. Accordingly, when the charging or discharge of the secondary battery begins, the accuracy of the state of charge estimation performed at S90 with the Extended Kalman Filter may be further enhanced by updating the initial value of the state of charge by using the current state of charge.

Further, the control unit 120 may display the current state of charge estimated in the key-off state with the graphic user interface through the display unit 150, or output the same to outside through the communication interface 160.

Further, the control unit 120 may estimate the state of health of the secondary battery with Equation 11 described above, using the changes in the current state of charge estimated in key-off state and the integrated current corresponding thereto.

Here, when the secondary battery changes into key-off state at time interval, the changes in the current state of charge refers to a difference between the current state of charge estimated in the previous key-off state and the current state of charge estimated in the present key-off state. Further, the integrated current refers to the currents integrated when the secondary battery is charged or discharged in the key-on state between the previous and present key-off states.

Further, the control unit 120 may store the state of health of the secondary battery estimated with Equation 11 described above into the storage unit 140, or display it through the display unit 150, or output it to outside through the communication interface 160.

Further, one or more of the control logics of the control unit 120 may be combined, and the combined control logics may be written by a computer-readable code system and recorded on a computer-readable recording medium. The recording medium is not limited to any specific type, as long as it is accessible by a processor included in the computer. In one example, the recording medium may include at least one selected from the group consisting of ROM, RAM, register, CD-ROM, magnetic tape, hard disk, floppy disk, and optical data recording device. Further, the code system may be modulated into carrier signals and included in the communication carriers at a specific time point, and distributed over a networked computer and stored and executed therein. Further, programmers in the technical field pertinent to the present disclosure will be easily able to envision functional programs, codes and code segments to implement the combined control logics.

EXAMPLES

In order to verify the effects of the present disclosure, a 37Ah secondary battery was prepared, including lithium metal oxide ($LiNi_xMn_yCo_zO_2$) and graphite in the positive electrode and the negative electrode, respectively.

Next, the secondary battery was discharged to the discharge voltage lower limit and turned into key-off state when the secondary battery is almost completely discharged. The state of charge was estimated with the Extended Kalman Filter according to the present disclosure since the time the discharging of the secondary battery begun until after the key-off time.

In this experiment, when the secondary battery was changed into key-off state, the state of charge noise $\sigma_{soc}^2$ and the polarization voltage noise $\sigma_{V1}^2$ were set to 0.1 and 0.0001, respectively such that the difference between the state of charge noise and the polarization voltage noise became 1000 times.

Figure 4:
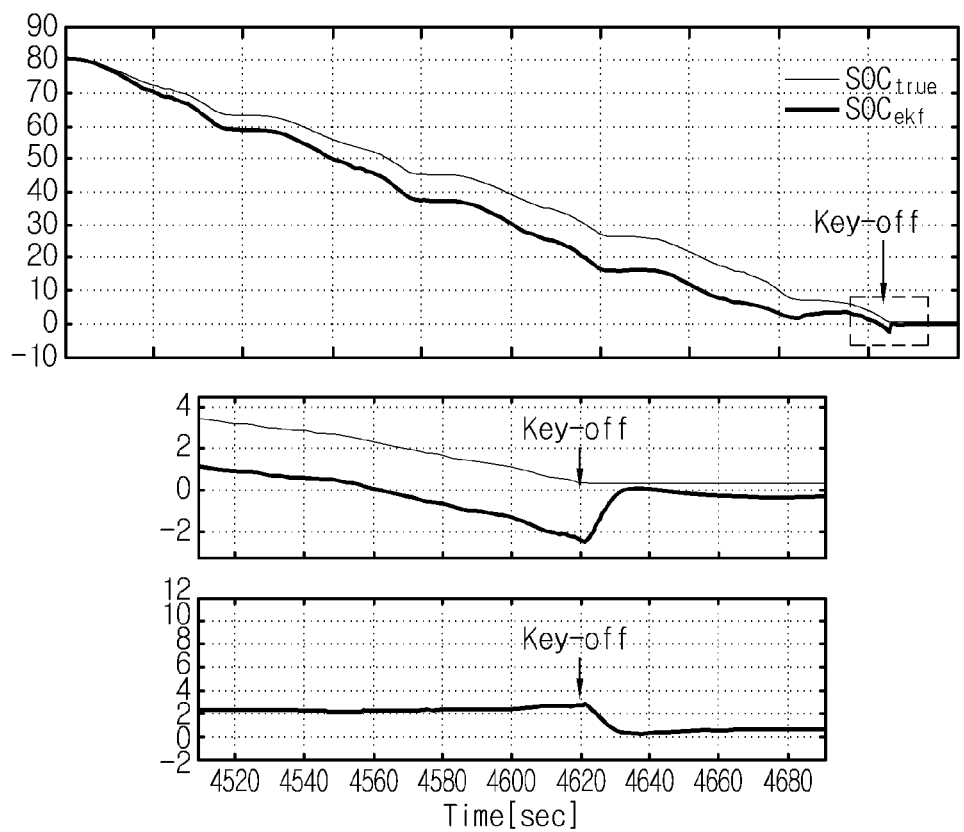
FIG. 4 is experimental data that shows error in the state of charge estimated by an apparatus for estimating state of charge rapidly decreasing after key-off time of the secondary battery, according to an exemplary embodiment.

FIG. 4 shows changes in the true state of charge, and the state of charge estimated according to the present disclosure together. Referring to FIG. 4, the graph in the upper half represents the profiles of the true state of charge and estimated state of charge across the entire segments of discharge time. The graph in the lower half enlarges around the key-off time of the secondary battery, to show the error changes between the true state of charge and the estimated state of charge according to time change.

When the secondary battery becomes key-off state, the voltage by the internal resistance and the polarization voltage gradually disappeared such that the voltage is gradually converged toward the open circuit voltage. Accordingly, the state of charge $SOC_{ekf}$ estimated by the Extended Kalman Filter also shows the changing behavior that converges towards the true state of charge value after the key-off time. Specifically, it is notable that the error of the state of charge estimated after the key-off time fast decreases to below 1% within 20 seconds.

In the second experiment, the same secondary battery mentioned above was discharged in the same manner and then key-offed when the true SOC became about 30%. A plurality of states of charge were then estimated using the first to third Extended Kalman Filters with different capacity parameters from each other, since the secondary battery begun discharging until after the key-off time.

The capacity parameters of the first to third Extended Kalman Filters were set to 1.0 times, 1.5 times, and 0.5 times the tuned parameter, respectively.

What is notable about this experiment is that the state of charge noise $\sigma_{soc}^2$ and the polarization voltage noise $\sigma_{V1}^2$ were set to 0.1 and 0.0001, respectively, such that large difference was set between the noises, even before the secondary battery was key-offed.

Figure 5:
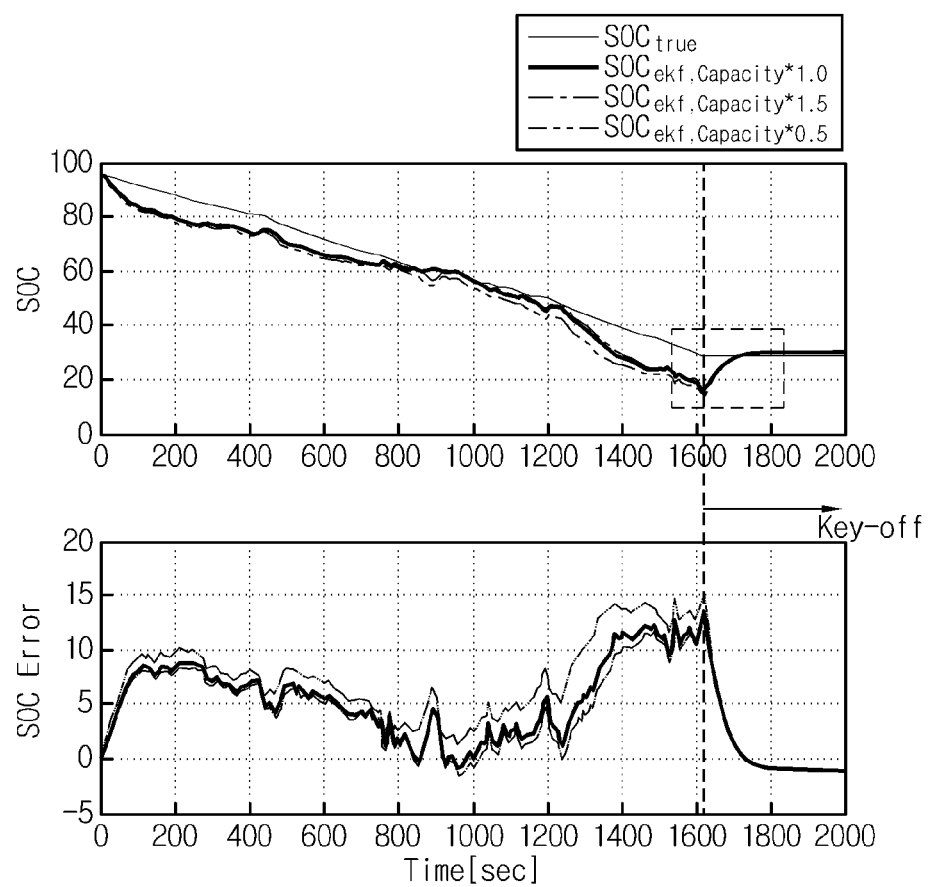
FIG. 5 is result of experiment that shows robustness of an apparatus for estimating state of charge against changes in capacity of the secondary battery, according to an exemplary embodiment.
Figure 6:
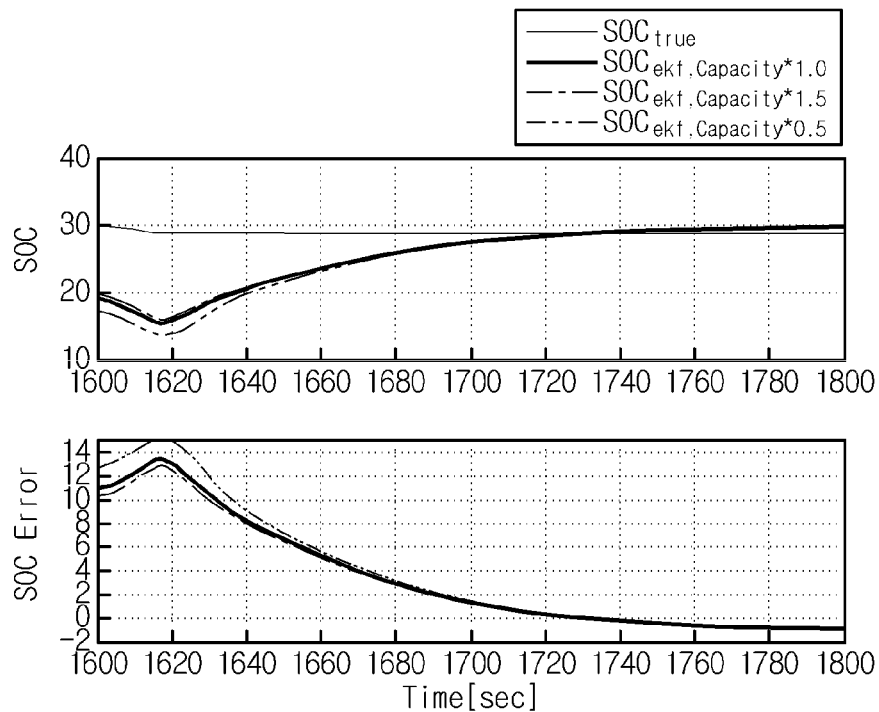
FIG. 6 is a graph illustrating in enlargement the boxed region in dotted line of FIG. 5.

FIG. 5 shows changes in the true state of charge $SOC_{true}$ together with the states of charge $SOC_{ekf,Capacity*1.0}$, $SOC_{ekf,Capacity*1.5}$, $SOC_{ekf,Capacity*0.5}$ estimated with the first to third Extended Kalman Filters. FIG. 6 shows the graph around the key-off time in enlargement. Referring to FIGS. 5 and 6, the graphs in the upper halves show the changes in the state of charge according to time, and the graphs in the lower halves show the changes in the state of charge errors according to time.

Referring to FIGS. 5 and 6, while the secondary battery is in the key-on state, it is understandable that the error of the estimated state of charge becomes less as the capacity parameter of the Extended Kalman Filter becomes greater than the tuned value.

However, the state of charge estimated after key-off time indicates that, irrespective of how large the difference of the capacity parameters is, the state of charge fast converges toward the true state of charge value and even the error in the estimated state of charge is reduced to below 2% in short time.

Such result of experiment supports the fact that the state of charge estimating apparatus according to the present disclosure shows robustness against capacity deterioration of the secondary battery after key-off time of the secondary battery.

In the third experiment, the same secondary battery mentioned above in the second experiment was discharged and then key-offed when the true SOC became about 30%. The states of charge were then estimated with the first and second Extended Kalman Filter with different capacity parameters and internal resistance parameters from each other since the secondary battery begun discharging until after the key-off time.

The capacity parameters of the first and second Extended Kalman Filters were set to 1.0 times and 0.5 times the tuned parameter, respectively. Further, the internal resistance parameters of the first and second Extended Kalman Filters were set to 1.0 times and 0.5 times the tuned parameter, respectively.

What is notable about this experiment is that the state of charge noise $\sigma_{soc}^2$ and the polarization voltage noise $\sigma_{V1}^2$ were set to 0.1 and 0.0001, respectively, such that large difference was set between the noises, even before the secondary battery was key-offed.

Figure 7:
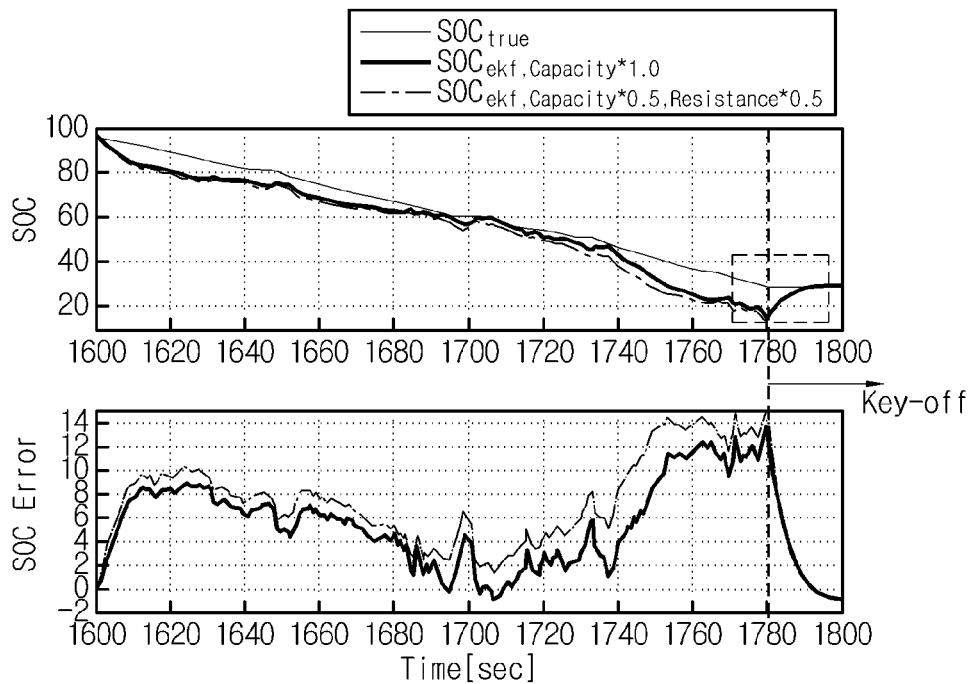
FIG. 7 is result of experiment that shows the fact that an apparatus for estimating state of charge according to an exemplary embodiment has robustness against changes in capacity and resistance of the secondary battery.
Figure 8:
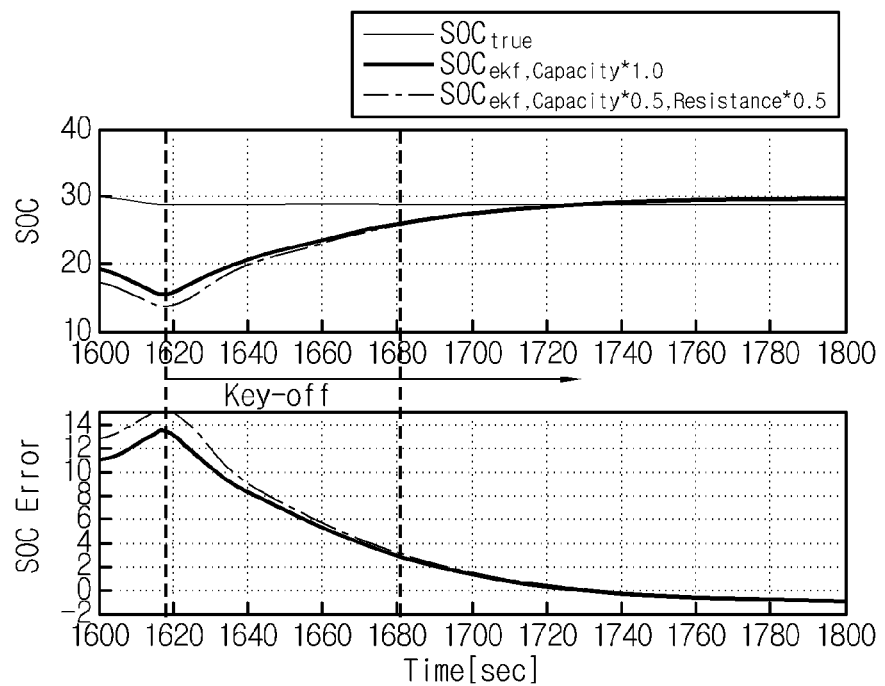
FIG. 8 is a graph illustrating in enlargement the boxed region in dotted line of FIG. 7.

FIG. 7 shows changes in the true state of charge $SOC_{true}$ together with the states of charge $SOC_{ekf,Capacity*1.0,resistance1.0}$ and $SOC_{ekf,Captacity*0.5,resistance*0.5}$ estimated with the first and second Extended Kalman Filters. FIG. 8 shows the graph around the key-off time in enlargement. Referring to FIGS. 7 and 8, the graphs in the upper halves show the changes in the state of charge according to time, and the graphs in the lower halves show the changes in the state of charge errors according to time.

Referring to FIGS. 7 and 8, with the secondary battery being in key-on state, it is understandable that the error of the estimated state of charge becomes greater as the capacity parameter and the resistance parameter of the Extended Kalman Filter has a difference from the tuned value.

However, the state of charge estimated after key-off time indicates that, irrespective of difference in the capacity parameter and the resistance parameter, the state of charge fast converges toward the true state of charge value and even the error in the estimated state of charge is reduced to below 2% in short time.

These results of experiment indicate that the state of charge estimating apparatus according to the present disclosure has robustness against the capacity and internal resistance deterioration of the secondary battery after the key-off time of the secondary battery.

In describing a variety of aspects of the present disclosure, the elements with names ending with 'unit' will have to be understood as the elements that are distinguished functionally, rather than being distinguished physically. Accordingly, the respective elements may be optionally incorporated with another element, or each of the elements may be divided into sub-elements such that the respective elements efficiently implement control logic(s). However, even when the elements are incorporated or divided, it will be obvious to those skilled in the art that the incorporated or divided elements also fall under the scope of the present disclosure, as long as the sameness of functions is acknowledged.

The present disclosure has been described in detail. However, it should be understood that the detailed description and specific examples, while indicating preferred embodiments of the disclosure, are given by way of illustration only, and various changes and modifications within the scope of the disclosure will become apparent to those skilled in the art from this detailed description.

INDUSTRIAL APPLICABILITY

The present disclosure gives the following effects. In estimating a state of charge of a secondary battery by using Extended Kalman Filter, the present disclosure can accurately estimate the state of charge of the secondary battery even when a parameter such as capacity or resistance changes by degradation of the secondary battery, and can reliably control the operations of the secondary battery by utilizing the estimated state of charge.

What is claimed is:

1. An apparatus for estimating a state of charge of a secondary battery with an Extended Kalman Filter, comprising:
    a sensor unit configured to measure, at time intervals, a voltage and a current of the secondary battery; and
    a control unit electrically connected to the sensor unit and configured to:
        estimate the state of charge of the secondary battery by repeatedly performing an algorithm of the Extended Kalman Filter by using a state equation that time-updates a state parameter including the state of charge of the secondary battery and a polarization voltage of the secondary battery, and an output equation that predicts the voltage of the secondary battery using an open circuit voltage according to the state of charge, the polarization voltage, and an internal resistance voltage generated by an internal resistance of the secondary battery;
        initiate charging and discharging of the battery based on the estimated state of the state of the secondary battery; and
        increase a time index of said Extended Kalman Filter algorithm in response to a continued charging or discharging of the secondary battery,
    wherein, the control unit determines the secondary battery is in key-off state using the measured current, and when implementing an algorithm of the Extended Kalman Filter, increases a difference between a state of charge noise regarding the state of charge, and a polarization voltage noise regarding the polarization voltage.

2. The apparatus of claim 1, wherein the control unit is configured to increase the state of charge noise and fix the polarization voltage noise; fix the state of charge noise and decrease the polarization voltage noise; or increase the state of charge noise and decrease the polarization voltage noise.

3. The apparatus of claim 2, wherein, when implementing an algorithm of the Extended Kalman Filter, the control unit is configured to decrease a sensor noise regarding the current and/or the voltage.

4. The apparatus of claim 1, wherein the state equation includes a state of charge update equation that time-updates the state of charge with ampere-counting.

5. The apparatus of claim 1, the state equation includes a polarization voltage update equation that time-updates the polarization voltage with a RC circuit.

6. The apparatus of claim 1, the output equation represents the voltage of the secondary battery as an output parameter according to a sum of the open circuit voltage, the polarization voltage, and the internal resistance voltage.

7. The apparatus of claim 1, further comprising a storage unit connected to the control unit, wherein the control unit is configured to store a convergence value of the state of charge estimated after key-off time of the secondary battery into the storage unit as a current state of charge of the secondary battery.

8. The apparatus of claim 1, further comprising a display unit connected to the control unit, wherein the control unit is configured to display a convergence value of the state of charge estimated after key-off time of the secondary battery as a current state of charge of the secondary battery in a form of graphic user interface (GUI) on the display unit.

9. The apparatus of claim 1, further comprising a communication interface connected to the control unit, wherein the control unit is configured to output a convergence value of the state of charge estimated after key-off time of the secondary battery as a current state of charge of the secondary battery to outside through the communication interface.

10. The apparatus of claim 1, wherein the control unit estimates a convergence value of the state of charge estimated after the key-off time of the secondary battery as a current state of charge of the secondary battery, and estimates a state of health of the secondary battery using changes in the estimated current state of charge.

11. A method for estimating a state of charge of a secondary battery with an Extended Kalman Filter, comprising:
    (a) measuring, at time intervals, a voltage and a current of the secondary battery;
    (b) repeatedly implementing a following algorithm of the Extended Kalman Filter including,
        time-updating a state parameter including the state of charge of the secondary battery and a polarization voltage of the secondary battery,
        time-updating an error covariance of the state parameter,
        predicting the voltage of the secondary battery corresponding to an output parameter using an open circuit voltage according to the state of charge, the polarization voltage, and an internal resistance voltage according to an internal resistance of the secondary battery,
        estimating a gain of the Extended Kalman Filter,
        estimating the state parameter using an error between the predicted voltage and the measured voltage and the estimated gain, and
        correcting the error covariance of the state parameter using the gain;
    (c) determining whether or not the secondary battery is in key-off state using the measured current;
    (d) when determining that the secondary battery is in key-off state, when implementing an algorithm of the Extended Kalman Filter, increasing a difference between a state of charge noise regarding the state of charge, and a polarization voltage noise regarding the polarization voltage;
    (e) initiating, the charging and discharging of the secondary battery based on the estimated state of the secondary battery; and
    (f) increasing a time index of said Extended Kalman Filter algorithm in response to a continued charging or discharging of the secondary battery.

12. The method of claim 11, wherein the step (d) comprises:
    increasing the state of charge noise and fixing the polarization voltage noise;
    fixing the state of charge noise and decreasing the polarization voltage noise; or increasing the state of charge noise and decreasing the polarization voltage noise.

13. The method of claim 12, further comprising:
when implementing an algorithm of the Extended Kalman Filter, decreasing a sensor noise regarding the current and/or the voltage.

14. The method of claim 11, further comprising estimating a convergence value of the state of charge estimated after key-off time of the secondary battery as a current state of charge of the secondary battery.

15. The method of claim 14, further comprising storing, displaying or outputting the current state of charge.

16. The method of claim 14, further comprising estimating a state of health of the secondary battery using the changes in the current state of charge that is estimated with the convergence value of the state of charge estimated when the secondary battery becomes key-off state.

* * * * *